(12) United States Patent
Huang et al.

(10) Patent No.: US 8,988,960 B2
(45) Date of Patent: Mar. 24, 2015

(54) TECHNIQUE FOR IMPROVING STATIC RANDOM-ACCESS MEMORY SENSE AMPLIFIER VOLTAGE DIFFERENTIAL

(71) Applicant: NVIDIA Corporation, Santa Clara, CA (US)

(72) Inventors: Yongchang Huang, Shanghai (CN); Jiping Ma, Shanghai (CN); Demi Shen, Shanghai (CN)

(73) Assignee: NVIDIA Corporation, Santa Clara, CA (US)

( * ) Notice: Subject to any disclaimer, the term of this patent is extended or adjusted under 35 U.S.C. 154(b) by 183 days.

(21) Appl. No.: 13/688,838

(22) Filed: Nov. 29, 2012

(65) Prior Publication Data

US 2014/0146628 A1    May 29, 2014

(51) Int. Cl.
*G11C 7/02* (2006.01)
*G11C 7/06* (2006.01)
*G11C 7/12* (2006.01)
*G11C 11/419* (2006.01)

(52) U.S. Cl.
CPC ............... *G11C 7/062* (2013.01); *G11C 7/065* (2013.01); *G11C 7/12* (2013.01); *G11C 11/419* (2013.01)

USPC .......................................................... 365/208

(58) Field of Classification Search
USPC .......................................................... 365/208
See application file for complete search history.

(56) References Cited

U.S. PATENT DOCUMENTS

| 5,936,881 | A  | * | 8/1999  | Kawashima et al. | ......... 365/149 |
| 6,288,952 | B1 | * | 9/2001  | Zheng | ...................... 365/189.11 |
| 2002/0079543 | A1 | * | 6/2002  | Yokozeki et al. | ............. 257/372 |
| 2005/0219192 | A1 | * | 10/2005 | Fujikawa | ........................ 345/98 |
| 2013/0021856 | A1 | * | 1/2013  | Kajigaya | .................. 365/189.14 |

* cited by examiner

*Primary Examiner* — Hoai V Ho
*Assistant Examiner* — Pablo Huerta
(74) *Attorney, Agent, or Firm* — Artegis Law Group, LLP

(57) ABSTRACT

A static random-access memory (SRAM) module includes a column select (RSEL) driver coupled to an input/output (I/O) circuit by an RSEL line. The I/O circuit is configured to read bit line signals from a bit cell within the SRAM module. During a read operation, the RSEL driver pulls the RSEL line to zero in order to cause p-type metal-oxide-semiconductors (PMOSs) within the I/O circuit to sample the bit line signals output by the bit cell. In response, an aggressor driver drives the RSEL line to a negative voltage, thereby reducing the resistance of the PMOSs within the I/O circuit.

20 Claims, 4 Drawing Sheets

TECHNIQUE FOR IMPROVING STATIC RANDOM-ACCESS MEMORY SENSE AMPLIFIER VOLTAGE DIFFERENTIAL

BACKGROUND OF THE INVENTION

1. Field of the Invention

The present invention generally relates to static random-access memory (SRAM), and, more specifically, a technique for improving SRAM sense amplifier voltage differential.

2. Description of the Related Art

A conventional SRAM module typically includes a collection of bit cells, where each bit cell is configured to store a logical value (e.g., a "0" or a "1"). During a read operation, a given bit cell outputs two voltage signals on two corresponding bit lines. Each bit line is coupled to a different p-type metal-oxide-semiconductor (PMOS) within an input/output (I/O) circuit residing downstream of the bit cell. The SRAM module causes the I/O circuit to sample the two voltage signals by asserting a column select signal to the two PMOSs. In response to the column select signal, each PMOS conducts a voltage to a sense amplifier also residing within the I/O circuit. The sense amplifier is configured to receive the voltage output by the PMOSs by way of two sense nodes, each coupled to a different one of the PMOSs. The sense amplifier measures the voltage differential between the two sense nodes and, based on the measured voltage differential, determines whether the bit cell output a "0" or a "1." This approach relies on a technique known in the art as "differential signaling."

One weakness of the approach described above is that the sense amplifier requires a large voltage differential between the sense nodes in order to accurately and quickly determine whether that differential represents a "0" or a "1." However, the voltage differential between the sense nodes, and therefore the read accuracy and speed of the I/O circuit in general, is sensitive to several factors. First, the PMOSs each cause a voltage drop from the corresponding bit lines, respectively, to the downstream sense nodes. That voltage drop degrades the voltage differential between the sense nodes. This issue is compounded by the fact that manufacturing differences across PMOSs may introduce unpredictable voltage drops across different PMOSs. Second, the supply voltage to the I/O circuit is continuously reduced over each development cycle, thereby decreasing the initial voltage differential between the bit lines and, in turn, the voltage differential between the sense nodes. In sum, the read accuracy and speed of conventional I/O circuits is limited by the voltage differential detected at the sense nodes of the sense amplifier.

Accordingly, what is needed in the art is a more effective technique for generating a voltage differential at the sense nodes of a sense amplifier.

SUMMARY OF THE INVENTION

One embodiment of the present invention includes memory module configured to perform a read operation, including a bit cell configured to store a logical value and to output the logical value via a first bit line and a second bit line, a first logic gate coupled to the first bit line, a second logic gate coupled to the second bit line, a sense amplifier configured to determine the logical value output by the bit cell based on a voltage differential between the first logic gate and the second logic gate, and an aggressor driver configured to output a first negative voltage to the first logic gate and the second logic gate during the read operation, wherein the voltage differential between the first logic gate and the second logic gate is based on the first negative voltage.

One advantage of the disclosed technique is that the voltage differential between the first bit line and the second bit line is preserved across the logic gates, enabling the sense amplifier to accurately and quickly determine the logical value output on the bit lines based on that preserved voltage differential. Accordingly, the read accuracy and speed of the memory module is less sensitive to process variations and supply voltage reductions that would otherwise degrade that voltage differential.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
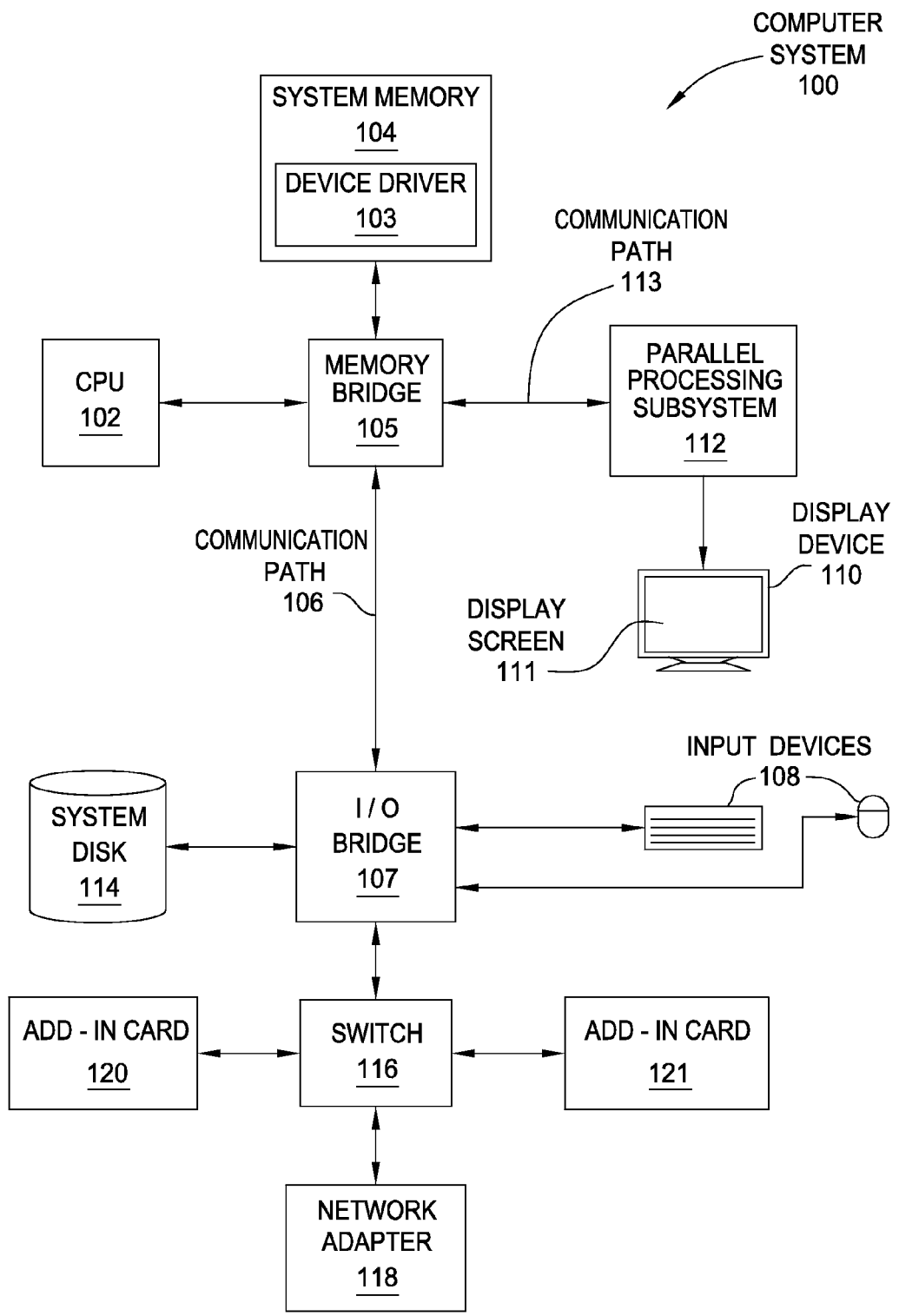
FIG. 1 is a block diagram that illustrates a computer system configured to implement one or more aspects of the present invention.

FIG. 1 is a block diagram that illustrates a computer system 100 configured to implement one or more aspects of the present invention. Computer system 100 includes a central processing unit (CPU) 102 and a system memory 104 that includes a device driver 103. CPU 102 and system memory 104 communicate via an interconnection path that may include a memory bridge 105. Memory bridge 105, which may be, e.g., a Northbridge chip, is connected via a bus or other communication path 106 (e.g., a HyperTransport link) to an input/output (I/O) bridge 107. I/O bridge 107, which may be, e.g., a Southbridge chip, receives user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a peripheral component interconnect (PCI) express, Accelerated Graphics Port (AGP), or HyperTransport link); in one embodiment parallel processing subsystem 112 is a graphics subsystem that delivers pixels to a display device 110 (e.g., a conventional cathode ray tube (CRT) or liquid crystal display (LCD) based monitor). A system disk 114 is also connected to I/O bridge 107. A switch 116 provides connections between I/O bridge 107 and other components such as a network adapter 118 and various add-in cards 120 and 121. Other components (not explicitly shown), including universal serial bus (USB) or other port connections, compact disc (CD) drives, digital video disc (DVD) drives, film recording devices, and the like, may also be connected to I/O bridge 107. Communication paths interconnecting the various components in FIG. 1 may be implemented using any suitable protocols, such as PCI, PCI Express (PCIe), AGP, Hyper-Transport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip. Large embodiments may include two or more CPUs 102 and two or more parallel processing systems 112. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

In one embodiment, parallel processing subsystem 112 includes one or more parallel processing unit (PPUs) each of which includes one or more SRAM modules. A given PPU may read data from or write data to an SRAM module coupled to that PPU. In various other embodiments, system memory 104 and/or other memory units within computer system 100 include one or more SRAM modules. Each such SRAM module may be implemented by the SRAM module described below in conjunction with FIGS. 2-4.

Improving SRAM Sense Amplifier Voltage Differential

Figure 2:
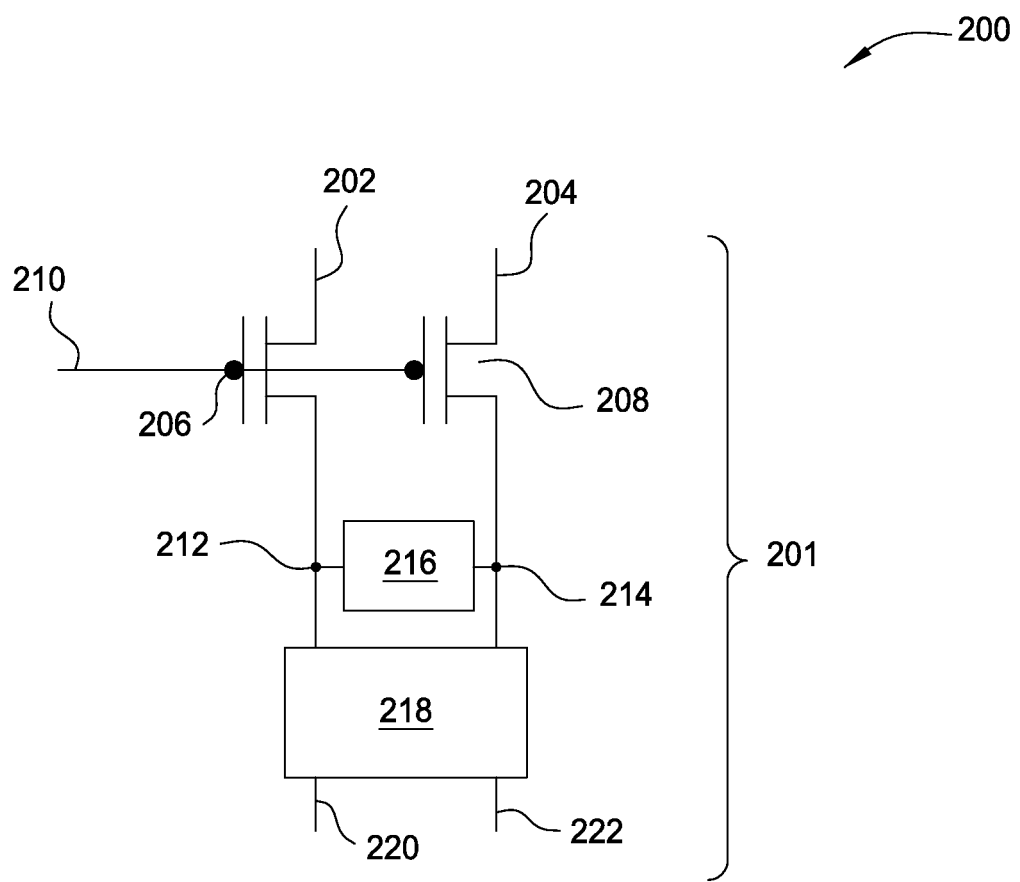
FIG. 2 is circuit diagram that illustrates an I/O circuit, according to one embodiment of the present invention.

FIG. 2 illustrates an I/O circuit 200, according to one embodiment of the present invention. I/O circuit 200 may reside within an SRAM module, as described in greater detail below in conjunction with FIG. 3. As shown, I/O circuit 200 includes p-type metal oxide semiconductors (PMOSs) 206 and 208 that are configured to receive bit lines (BLs) 202 and 204, respectively, from an upstream bit cell (not shown). PMOSs 206 and 208 are also configured to receive a column select signal from RSEL line 210. PMOS 206 is coupled to a downstream sense node (SN) 212, while PMOS 208 is coupled to downstream SN 214. Each of SNs 212 and 214 is coupled to a sense amplifier 216 and to a sense amplifier latch 218 that, in turn, is configured to output data 220 and data 222.

During a read operation, the upstream bit cell outputs voltage signals along BLs 202 and 204 to PMOSs 206 and 208. RSEL 210 is pulled to zero volts, thereby acting as a sampling switch that causes PMOSs 206 and 208 to propagate the voltage signals received from BLs 202 and 204, respectively, to SNs 212 and 214, respectively. Sense amplifier 216 detects the voltage difference between SNs 212 and 214 and then produces a full logic output, i.e. a "0" or "1," based on the detected voltage difference. Sense amplifier latch 218 is configured to record this logic output using internal latch circuitry and to output data 220 and 222 that represent the state of that latch circuitry. With this approach, data from the upstream bit cell may be read, latched, and output by I/O circuit 200.

When I/O circuit 200 resides within a conventional SRAM module, the voltage differential between SNs 212 and 214, and therefore the read accuracy and speed of I/O circuit 200 in general, is sensitive to several factors. First, PMOS 206 and 208 each may cause a voltage drop from BLs 202 and 204, respectively, to SNs 212 and 214, respectively. That voltage drop may degrade the voltage differential between SNs 212 and 214. This issue may be compounded by the fact that manufacturing differences across PMOSs may introduce unpredictable voltage drops across different PMOSs. Additionally, a lower supply voltage to I/O circuit 200 may reduce the initial voltage differential between BL 202 and BL 204 and, in turn, the voltage differential between SNs 212 and 214. In order to mitigate such issues associated with conventional SRAM modules, the SRAM module of the present invention includes specialized circuitry configured to maintain an accurate voltage differential between sense nodes, as described in greater detail below in conjunction with FIG. 3.

Figure 3:
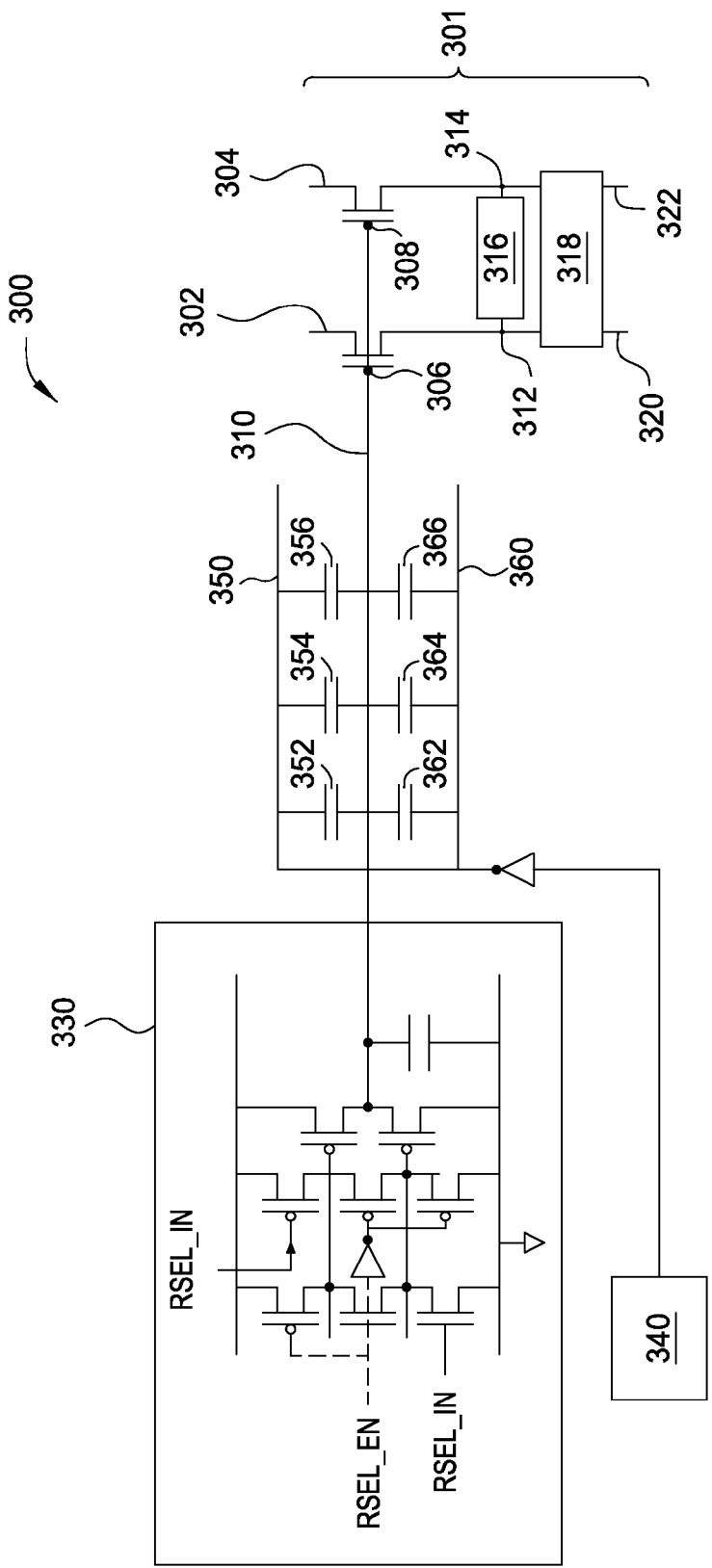
FIG. 3 is a circuit diagram that illustrates a portion of an SRAM module, according to one embodiment of the present invention.

FIG. 3 is a circuit diagram that illustrates a portion 300 of an SRAM module, according to one embodiment of the present invention. As shown, portion 300 includes an RSEL driver 330 coupled to an I/O circuit 301 by a column select line (RSEL) line 310. I/O circuit 301 may be substantially similar to I/O circuit 200 described above in conjunction with FIG. 2. RSEL line 310 is capacitively coupled to an aggressor line 350 by capacitors 352, 354, and 356, and also capacitively coupled to an aggressor line 360 by capacitors 362, 364, and 366. Aggressor lines 350 and 360 are driven by aggressor driver 340.

I/O circuit 301 includes PMOSs 306 and 308 that are configured to receive bit line signals BL 302 and BL 304, respectively, from an upstream bit cell (not shown). PMOSs 306 and 308 are also configured to receive a column select signal from RSEL line 310. PMOS 306 is coupled to a downstream sense node (SN) 312, while PMOS 308 is coupled to downstream SN 314. Each of SNs 312 and 314 is coupled to a sense amplifier 316 and to a sense amplifier latch 318 that, in turn, is configured to output data 320 and data 322. Each component of I/O circuit 301 described herein may be substantially similar to a corresponding component within I/O circuit 200 shown in FIG. 2.

During a read operation, the upstream bit cell outputs voltage signals along BLs 302 and 304 to PMOSs 306 and 308. RSEL driver 330 is configured to pull RSEL line 310 to zero volts and, in response, aggressor driver 340 causes aggressor lines 350 and 360 to undergo a negative transition. The negative transition of aggressor lines 350 and 360 drives RSEL line 310 to a negative voltage. RSEL line 310 conducts this negative voltage to PMOS 306 and 308, thereby lowering the resistance of those PMOSs by an amount proportional to the negative voltage of RSEL line 310. PMOSs 306 and 308 then propagate the voltage signals received from BL 302 and 304, respectively, with minimal voltage drop to SNs 312 and 314, respectively. Sense amplifier 316 detects the voltage difference between SNs 312 and 314 produce a full logic output, i.e. a "0" or "1," based on the detected voltage differential. Sense amplifier latch 318 is configured to record this logic output using internal latch circuitry and to output data 320 and 322 that represent the state of that latch circuitry.

In practice, sense amplifier 316 outputs data 320 and 322 based on the voltage differential between SNs 312 and 314. That voltage differential is in turn derived from the voltage differential between BLs 302 and 304 and the voltage drop across PMOS 306 and 308. Since RSEL line 310 conducts a negative voltage to PMOS 306 and 308 during the read operation (i.e., due to the negative transition of aggressor lines 350 and 360), the resistance of PMOSs 306 and 308 is temporarily reduced and, thus, the voltage drop across PMOSs 306 and 308 is minimized. With this approach, the initial voltage differential between BLs 302 and 304, and therefore the voltage differential between SNs 312 and 314, may be accurately preserved without significant degradation. Consequently, the accuracy of the logic output by sense amplifier 316 and the speed with which sense amplifier 316 is capable of operating is increased.

In one embodiment, the magnitude of the negative voltage of RSEL line 310 caused by aggressor lines 350 and 360 may be configured based on the ratio between the coupling capacitance provided by the capacitors associated with aggressor lines 350 and 360 and the total capacitance of RSEL driver 330. That ratio may be modified by altering the capacitance of RSEL driver 330 or by including one or more metal-oxide semiconductors (MOS) capacitors between aggressor lines 350 and 360 and RSEL line 310. Aggressor lines 350 and 360 may also be configured to provide shielding for RSEL line 310 from external sources of noise.

In another embodiment, aggressor driver 340 is configured to detect a high Z state of RSEL driver 330 prior to sense amplifier 316 amplifying voltage detected at SNs 312 and 314. In response, aggressor driver 340 causes aggressor lines 350 and 360 to undergo the negative transitions described above. As mentioned above, portion 300 may reside within an SRAM module that, in turn, resides within system memory 103 or memory coupled to one or more PPUs residing within parallel processing subsystem 112 shown in FIG. 1.

The operation of portion 300 of the SRAM module during a read operation is further described below in conjunction with FIG. 4.

Figure 4:
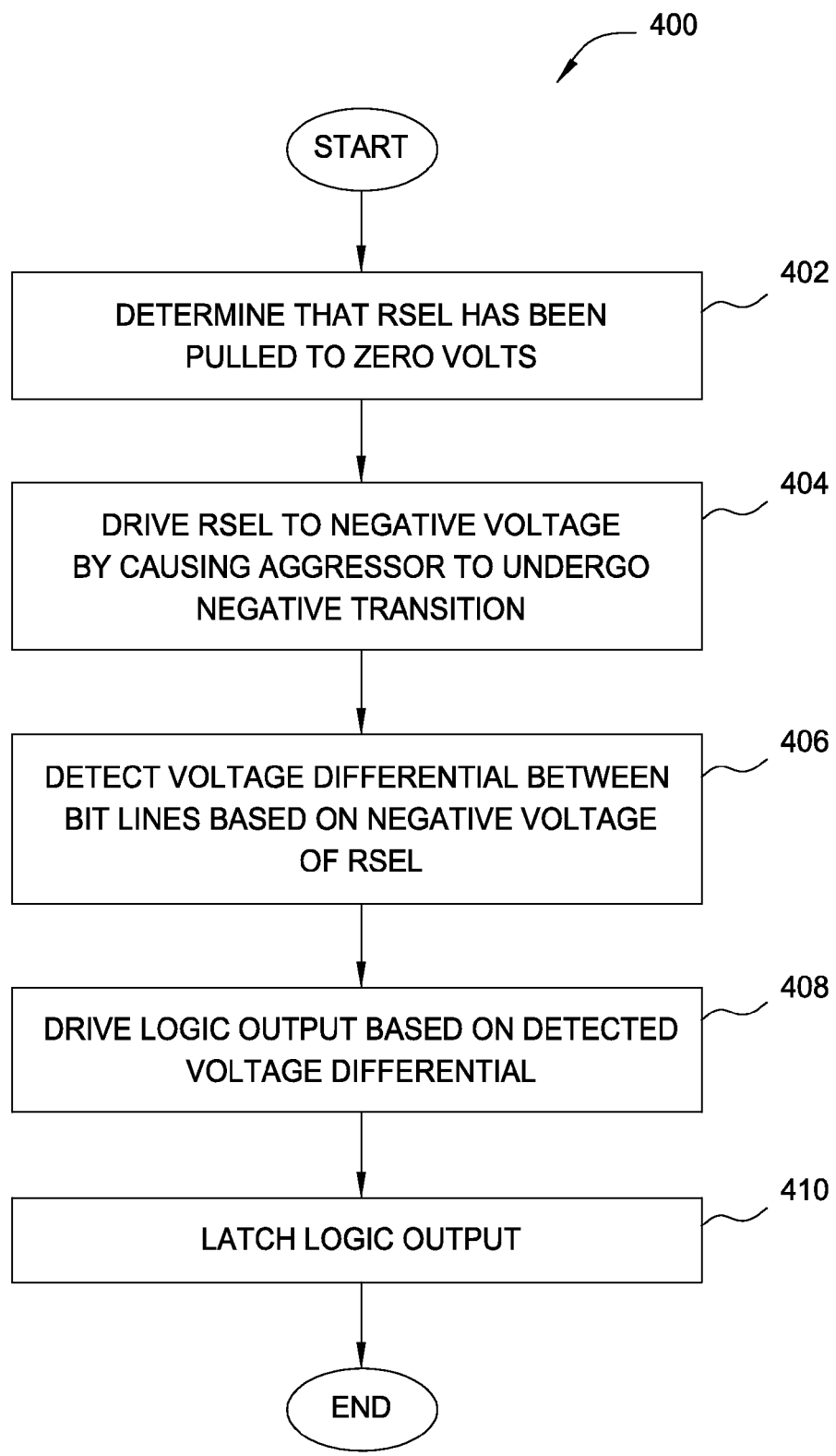
FIG. 4 is a flow diagram of method steps for performing a read operation with the portion of the SRAM module described in conjunction with FIG. 3, according to one embodiment of the invention.

FIG. 4 is a flow diagram of method steps for performing a read operation with portion 300 of the SRAM module described in conjunction with FIG. 3, according to one embodiment of the invention. Although the method steps are described in conjunction with the portion 300 of the SRAM module described in conjunction with FIG. 3, persons skilled in the art will understand that any system configured to perform the method steps, in any order, is within the scope of the present invention.

As shown, a method 400 begins at step 402, where aggressor driver 340 determines that RSEL line 310 has been pulled to zero volts. At step 404, aggressor driver 340 drives RSEL line 310 to a negative voltage by causing aggressor lines 350 and 360 to undergo a negative transition. In one embodiment, aggressor driver 340 may detect a high Z state of RSEL driver 330 prior to sense amplifier 316 amplifying voltage detected at SNs 312 and 314 and, in response, cause aggressor lines 350 and 360 to undergo the negative transition. Aggressor lines 350 and 360 are configured to induce the negative voltage of RSEL lines 310 via capacitors 352, 354, 356, 362, 364, and 366.

At step 406, sense amplifier 316 detects the voltage differential between BLs 302 and 304 based on the negative voltage of RSEL line 310. The voltage differential between BLs 302 and 304 may be conducted to sense amplifier 316 by way of SNs 312 and 314 with minimal degradation based on the magnitude of the negative voltage of RSEL line 310. At step 408, sense amplifier 316 drives a logic output (i.e., a "0" or a "1") to sense amplifier latch 318 based on the voltage differential detected at SNs 312 and 314. At step 410, sense amplifier latch 318 latches that logic output for output along data lines 320 and 322. The method then ends.

In sum, a static random-access memory (SRAM) module includes a column select (RSEL) driver coupled to an input/output (I/O) circuit by an RSEL line. The I/O circuit is configured to read bit line signals from a bit cell within the SRAM module. During a read operation, the RSEL driver pulls the RSEL line to zero in order to cause p-type metal-oxide-semiconductors (PMOSs) within the I/O circuit to sample the bit line signals output by the bit cell. In response, an aggressor driver drives the RSEL line to a negative voltage, thereby reducing the resistance of the PMOSs within the I/O circuit.

Advantageously, the voltage differential between the bit line signals is preserved across the PMOSs, enabling a sense amplifier within the I/O circuit to accurately and quickly determine the logical value represented by those bit line signals based on that preserved voltage differential. Accordingly, the read accuracy and speed of the SRAM module is less sensitive to process variations and supply voltage reductions that would otherwise degrade that voltage differential.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

The invention claimed is:

1. A memory module configured to perform a read operation, the memory module comprising:
   a bit cell configured to store a logical value and to output the logical value via a first bit line and a second bit line;
   a first logic gate coupled to the first bit line;
   a second logic gate coupled to the second bit line;
   a sense amplifier configured to determine the logical value output by the bit cell based on a voltage differential between the first logic gate and the second logic gate;

an aggressor driver configured to output a first negative voltage to the first logic gate and to the second logic gate during the read operation, wherein the voltage differential between the first logic gate and the second logic gate is based on the first negative voltage;

a first aggressor line coupled to the aggressor driver and capacitively coupled to a column select line; and a second aggressor line coupled to the aggressor driver and capacitively coupled to the column select line.

2. The memory module of claim 1, wherein outputting the first negative voltage to the first logic gate and the second logic gate reduces a magnitude of a voltage drop across each of the first logic gate and the second logic gate.

3. The memory module of claim 1, wherein the memory module comprises static random-access memory (SRAM).

4. The memory module of claim 1, wherein each of the first logic gate and the second logic gate comprises a p-type metal-oxide-semiconductor (PMOS).

5. A memory module configured to perform a read operation, the memory module comprising:

a bit cell configured to store a logical value and to output the logical value via a first bit line and a second bit line;

a first logic gate coupled to the first bit line;

a second logic gate coupled to the second bit line;

a sense amplifier configured to determine the logical value output by the bit cell based on a voltage differential between the first logic gate and the second logic gate;

an aggressor driver configured to output a first negative voltage to the first logic gate and to the second logic gate during the read operation, wherein the voltage differential between the first logic gate and the second logic gate is based on the first negative voltage;

an input/output (I/O) circuit that includes the first logic gate, the second logic gate, and the sense amplifier;

a column select driver coupled to the first logic gate and the second logic gate within the I/O circuit by a column select line;

a first aggressor line coupled to the aggressor driver and capacitively coupled to the column select line; and a second aggressor line coupled to the aggressor driver and capacitively coupled to the column select line, wherein the aggressor driver is configured to output the first negative voltage to the first logic gate and the second logic gate by causing the column select line to undergo a negative transition.

6. The memory module of claim 5, wherein the aggressor driver is configured to cause the column select line to undergo the negative transition by outputting a second negative voltage to the first aggressor line and the second aggressor line.

7. The memory module of claim 5, wherein the first negative voltage is based on a ratio between the capacitance of the column select driver and the coupling capacitance of the first aggressor line and the second aggressor line relative to the column select line.

8. The memory module of claim 7, wherein the coupling capacitance of the first aggressor line and the second aggressor line relative to the column select line is caused by one or more metal-oxide-semiconductor (MOS) capacitors coupled between either of the first aggressor line and the second aggressor line, and the column select line.

9. A computing device configured to perform a read operation, the computing device comprising:

a processing unit configured to cause a memory module to perform the read operation; and the memory module, including:

a bit cell configured to store a logical value and to output the logical value via a first bit line and a second bit line;

a first logic gate coupled to the first bit line;

a second logic gate coupled to the second bit line;

a sense amplifier configured to determine the logical value output by the bit cell based on a voltage differential between the first logic gate and the second logic gate;

an aggressor driver configured to output a first negative voltage to the first logic gate and to the second logic gate during the read operation, wherein the voltage differential between the first logic gate and the second logic gate is based on the first negative voltage;

a first aggressor line coupled to the aggressor driver and capacitively coupled to a column select line; and a second aggressor line coupled to the aggressor driver and capacitively coupled to the column select line.

10. The computing device of claim 9, wherein outputting the first negative voltage to the first logic gate and the second logic gate reduces a magnitude of a voltage drop across each of the first logic gate and the second logic gate.

11. The computing device of claim 9, wherein the memory module comprises static random-access memory (SRAM).

12. The computing device of claim 9, wherein each of the first logic gate and the second logic gate comprises a p-type metal-oxide-semiconductor (PMOS).

13. A computing device configured to perform a read operation, the computing device comprising:

a processing unit configured to cause a memory module to perform the read operation; and the memory module, including:

a bit cell configured to store a logical value and to output the logical value via a first bit line and a second bit line;

a first logic gate coupled to the first bit line;

a second logic gate coupled to the second bit line;

a sense amplifier configured to determine the logical value output by the bit cell based on a voltage differential between the first logic gate and the second logic gate;

an aggressor driver configured to output a first negative voltage to the first logic gate and to the second logic gate during the read operation, wherein the voltage differential between the first logic gate and the second logic gate is based on the first negative voltage;

an input/output (I/O) circuit that includes the first logic gate, the second logic gate, and the sense amplifier;

a column select driver coupled to the first logic gate and the second logic gate within the I/O circuit by a column select line;

a first aggressor line coupled to the aggressor driver and capacitively coupled to the column select line; and a second aggressor line coupled to the aggressor driver and capacitively coupled to the column select line, wherein the aggressor driver is configured to output the first negative voltage to the first logic gate and the second logic gate by causing the column select line to undergo a negative transition.

14. The computing device of claim 13, wherein the aggressor driver is configured to cause the column select line to undergo the negative transition by outputting a second negative voltage to the first aggressor line and the second aggressor line.

15. The computing device of claim 13, wherein the first negative voltage is based on a ratio between the capacitance of the column select driver and the coupling capacitance of the first aggressor line and the second aggressor line relative to the column select line.

16. The computing device of claim 15, wherein the coupling capacitance of the first aggressor line and the second aggressor line relative to the column select line is caused by one or more metal-oxide-semiconductor (MOS) capacitors coupled between either of the first aggressor line and the second aggressor line, and the column select line.

17. A computer-implemented method for reading a logical value stored by a bit cell residing within a memory module, the method comprising:
   determining that a column select line has been pulled to zero volts; and
   causing the column select line to undergo a negative transition by outputting a negative voltage to a first aggressor line and a second aggressor line, wherein the first aggressor line and the second aggressor line are capacitively coupled to the column select line, and wherein the logical value is determined based on a voltage differential between a first logic gate and a second logic gate each coupled to the column select line.

18. The computer-implemented method of claim 17, further comprising:
   detecting the voltage differential between the first logic gate and the second logic gate;
   generating a logic output based on the voltage differential between the first logic gate and the second logic gate; and
   latching the logic output, wherein the logic output represents the logical value stored by the bit cell.

19. The computer-implemented method of claim 17, wherein the memory module comprises static random-access memory (SRAM).

20. The computer-implemented method of claim 17, wherein each of the first logic gate and the second logic gate comprises a p-type metal-oxide-semiconductor (PMOS).

* * * * *